FIG. 1
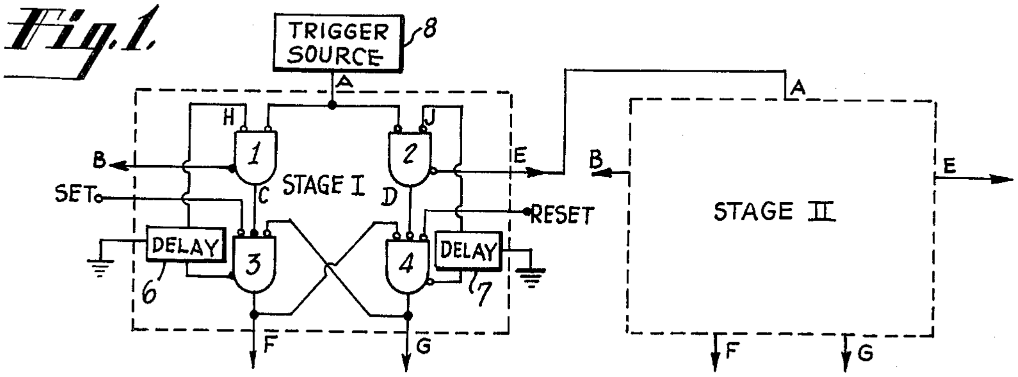
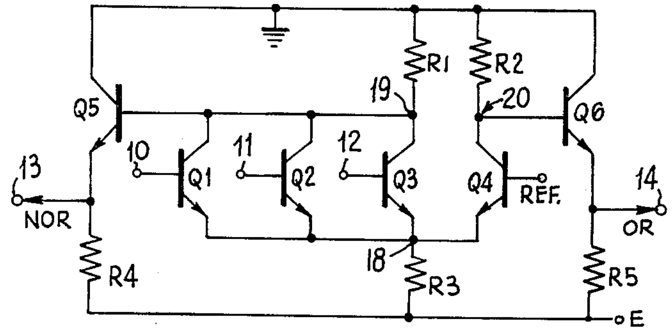
FIG. 2
TRIGGER INPUT
| | | | | | | | | |
|---|---|---|---|---|---|---|---|---|
| A | 0 | 1 | 0 | 1 | 0 | 1 | 0 | 1 |
| B | 0 | 1 | 0 | 0 | 0 | 1 | 0 | 0 |
| C | 1 | 0 | 1 | 1 | 1 | 0 | 1 | 1 |
| D | 1 | 1 | 1 | 0 | 1 | 1 | 1 | 0 |
| E | 0 | 0 | 0 | 1 | 0 | 0 | 0 | 1 |
| F | 0 | 1 | 1 | 0 | 0 | 1 | 1 | 0 |
| G | 1 | 0 | 0 | 1 | 1 | 0 | 0 | 1 |
| H | 1 | 1 | 0 | 0 | 1 | 1 | 0 | 0 |
| J | 0 | 0 | 1 | 1 | 0 | 0 | 1 | 1 |
FIG. 4
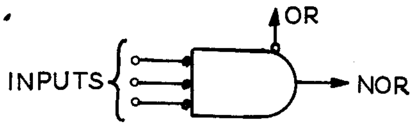
FIG. 3
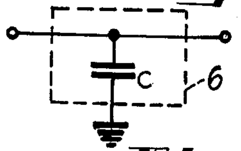
FIG. 5
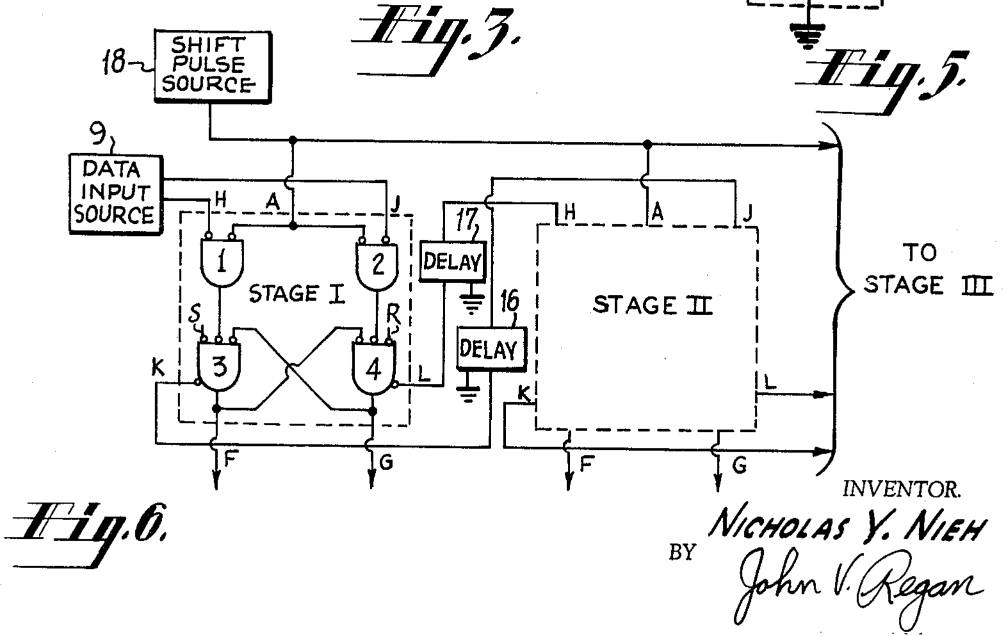
FIG. 6
INVENTOR.
NICHOLAS Y. NIEH
BY John V. Regan United States Patent Office 3,219,845
Patented Nov. 23, 1965

3,219,845

BISTABLE ELECTRICAL CIRCUIT UTILIZING NOR CIRCUITS WITHOUT A.C. COUPLING

Nicholas Y. Nieh, Runnemede, N.J., assignor to Radio Corporation of America, a corporation of Delaware Filed Dec. 7, 1964, Ser. No. 416,413
9 Claims. (Cl. 307—88.5)

This invention relates generally to data processing machines, and particularly to electrical circuits for use as bistable stages in such devices as counters, shift registers and the like.

More specifically, the invention provides an interconnection of logical gate elements to form a bistable electrical circuit or flip-flop.

One class of prior art flip-flop circuits includes A.C. coupled flip-flops having at least two NOR gates. A disadvantage of such a circuit is that the trigger input pulse repetition rate is limited due to A.C. coupling capacitors. A further disadvantage is that the set and reset inputs to the flip-flops are not isolated from the trigger outputs. Another disadvantage is that there is no rejection of high frequency noise due to the A.C. coupling.

Another class of prior art flip-flop circuits includes direct coupled NOR gates which avoids the disadvantage arising from the A.C. coupling. However, these prior art direct coupled flip-flops require at least six logical NOR gate elements to form the flip-flop. Another disadvantage of such a circuit is that there is a large time delay between the application of the trigger input pulse pulse and the appearance of a useable trigger output pulse because the input energy has to traverse two or more of the gate elements before an output is obtained.

A further disadvantage of the prior art flip-flop circuits, in general, is that the NOR gate transistors are operated between a saturated state and a non-saturated state. Consequently, the time delay is even further increased due to stored charge delays associated with transistors operating in the saturation region.

A general object of the present invention is to provide a flip-flop circuit wherein only four logical gate elements are needed and wherein a delay of only one gate time is experienced by the trigger signal.

Another object of the invention is to eliminate noise generated at the trigger output when the flip-flop is set or reset by isolating the trigger output from the set and reset inputs.

A further object of the invention is to lessen the time delay experienced by a single logic element.

A further object of the invention is to provide a pulse counter and shift register circuits having a plurality of bistable flip-flops wherein the delay is only one gate element per flip-flop.

A flip-flop, in accordance with the present invention, has four logical elements each having an input means and first and second complementary output means. A signal applying means is coupled to first and second ones of the elements. Means are provided to couple the first complementary output means of the first and second elements to the input means of the third and fourth elements, which are cross coupled to each other. Stable trigger output signals are obtained from the second complementary output means of the first and second elements resulting in a time delay of only a single gate element. Set and reset signals are applied to the third and fourth elements whereby isolation between the flip-flop input and output signals is achieved.

Another feature of the invention is the use of emitter coupled current-steering logical elements wherein the transistors are operated well out of the saturation region.

Such current-steering circuits are easily fabricated into integrated circuits.

FIGURE 1 is a circuit diagram of a pulse counter utilizing a triggerable flip-flop in accordance with this invention;

FIGURE 2 is a detailed circuit diagram of one form of logical elements which may be used in the flip-flop of FIGURE 1;

FIGURE 3 is a diagram of the logical symbol used to represent the circuit of FIGURE 2;

FIGURE 4 is a table utilizing the signals developed on the various outputs of FIGURE 1 as the trigger input pulse changes level;

FIGURE 5 is an example of a delay means which may be used with this invention; and FIGURE 6 is a circuit diagram of a shift register using the flip-flop circuit of this invention.

The circuit diagram of FIGURE 2 is a schematic diagram of a known type of emitter-coupled, current-steering logical element having input means indicated as terminals 10, 11 and 12 and first and second complementary output means indicated as terminals 13 and 14. Input transistors Q1, Q2 and Q3 along with transistor Q4 have their emitters connected to one terminal of a common resistor R3 at junction 18. The other terminal of resistor R3 is connected to a supply voltage E. The collectors of transistors Q1, Q2 and Q3 are connected to the base of an emitter follower transistor Q5 and to a resistor R1 at a junction 19. The collector of transistor Q4 is connected to the base of an emitter follower transistor Q6 and to a resistor R2. Input terminals 10, 11 and 12 are connected to the bases of transistors Q1, Q2 and Q3, respectively. A fixed reference voltage V is connected to the base of transistor Q4. Resistors R4 and R5 connect the emitters of output transistors Q5 and Q6, respectively to the supply voltage E.

For illustrative purposes, assume that the fixed reference voltage V is −1.2 volts, supply voltage E is −5 volts, and the input signals applied to the bases of input transistors Q1, Q2 and Q3 have values of either −1.6 volts or −0.8 volt.

In operation, if the input signals applied at the bases of transistors Q1, Q2 and Q3 have the lower value of −1.6 volts, the voltage applied at the base of transistor Q4 is more positive than the signal voltages, whereby transistor Q4 conducts. All of the other transistors Q1, Q2 and Q3 are cut off at this time and the current from common emitter resistor R3 flows through transistor Q4 to the exclusion of transistors Q1, Q2 and Q3. The voltage drop across R2 makes the base of transistor Q6 more negative with respect to its emitter (with junction 20 at about −0.8 volt) whereby transistor Q6 cuts off momentarily and then stabilizes in a lower conduction state. Consequently, terminal 14 is at a binary 1 level of −1.6 volts (the voltage at junction 20 plus the base-to-emitter drop of Q6). Junction 19 is at ground or zero volt. Assuming that the base-to-emitter voltage drop of each of the transistors is 0.8 volt, the voltage at terminal 13 is −0.8 volt.

If the input at any one of the transistors Q1, Q2 or Q3 should rise to the binary 0 level of −0.8 volt, the respective transistor is rendered conductive. Transistor Q4 is cut off at this time. The potential at terminal 19 falls to −0.8 volt and changes transistor Q5 to its low-conduction state. Consequently, the voltage at output terminal 13 would be at a binary 1 level of −1.6 volts. Since the base of transistor Q6 is near ground potential, Q6 goes into its high conduction state. Consequently, terminal 14 is at a binary 0 level of −0.8 volt. It should be noted that none of the transistors Q1 through Q6 is operated into saturation. Thus, the voltage levels at output terminals 13 and 14 respond very rapidly to the application of input signals to the bases of transistors Q1, Q2 and Q3.

FIGURE 3 is a logical symbol representing the circuit of FIGURE 2. The three input terminals correspond to input terminals 10, 11 and 12 in FIGURE 2. The terminals labeled NOR and OR correspond to output terminals 13 and 14, respectively, in FIGURE 2. This symbol will be used throughout the specification to represent the circuit of FIGURE 2.

FIGURE 1 is a circuit diagram showing two stages of an *n* stage counter where *n* is an integer. Each stage of the counter has four logical elements 1 through 4, inclusive, each including an input means, a NOR output means, and an OR output means. Each logical element is represented by the symbol described in FIGURE 3. One input of logical elements 1 and 2 is connected to a common trigger terminal A which is connected to a trigger source 8. Trigger source 8 constitutes a source of pulses to be counted. The NOR output C of logical element 1 is connected to an input of logical element 3. The OR output of logical element 1 is connected to an output terminal B. The NOR output D of logical element 2 is connected to an input of logical element 4. The OR output of logical element 2 is connected to a second output terminal E. A set terminal is connected to an input of logical element 3. A reset terminal is connected to an input of logical element 4. The NOR output of logical element 3 is connected to a third output terminal F and to an input of logical element 4. The NOR output of logical element 4 is connected to a fourth output terminal G and to an input of logical element 3. The OR output of logical element 3 is connected through a delay means 6 to an input H of logical element 1. The OR output of logical element 4 is connected through a delay means 7 to an input J of logical element 2. The second output terminal E of stage 1 is connected to the trigger terminal A of stage 2. The second output terminal E of stage 2 is connected to the trigger terminal A of stage 3 (not shown), and so on.

In operation, the trigger point A is normally held at a relatively high or binary 0 level by trigger source 8. The flip-flop is set or reset by applying a pulse to the appropriate set or reset terminal. Output terminal G is at a relatively low or binary 1 level and output terminal F at a relatively high or binary 0 level when the flip-flop is reset. Trigger output terminals B and E are undisturbed during the reset operation because terminal A is held at the high or binary 0 level.

The operation of the circuit in response to low level trigger pulses applied at terminal A by trigger source 8 is best understood with reference to FIGURE 4. FIGURE 4 is a table portraying the levels of the various points in the circuit as the trigger signal varies between the binary 0 and the binary 1 levels. Assuming that a reset operation has just occurred, terminals A through J are at the levels shown in the left-hand column of FIGURE 4. Terminals G and H are at the binary 1 level and terminals H and J change to the binary 0 and 1 levels, reger pulse to arrive at point A causes terminal C to attain a binary 0 level because both terminals A and H are at a low or binary 1 level. Logical element 2 remains unchanged because point J is at a high or binary 0 level. Since point C is at a binary 0 level, the flip-flop is set such that terminal F attains a binary 1 level and terminal G, a binary 0 level. Terminals H and J do not change levels at the same time as terminals F and G because of the delay means 6 and 7 which are operative to prevent a race condition. Each of the delay means 6 and 7 delays the level changes at H and J for the duration of the trigger pulse at A. As the trigger pulse terminates, terminals H and J change to the binary 0 and 1 levels, respectively. The remainder of the flip-flop is unaffected by this change since the trigger pulse is now at a binary 0 level. When the second trigger input pulse is applied, terminal E changes from a binary 0 to a binary 1 level, since both input terminals A and J of element 2 are at a binary 1 level. The terminals B and C do not change levels, since the input H is at a high or binary 0 level. The binary 0 level at point D causes the elements 3 and 4 to change state. Consequently, terminal E produces a binary 1 signal for every two binary 1 signals applied at terminal A. Similarly, terminal B produces a binary 1 signal for every two binary 1 signals applied at terminal A. The trigger output pulse at either output terminal E or terminal B experiences a delay time of only one logical element.

The circuit diagram as shown in FIGμRE 1 is descriptive of an incrementing counter. A decrementing counter is constructed by interchanging the B and E output terminal connections. Instead of terminal E of each stage being connected to the input terminal A of the succeeding stages, terminal B of each stage should be so connected.

FIGURE 5 is an example of a delay means which can be used with this invention. The dotted lines correspond to the block diagram 6 or 7 shown in FIGURE 1. The capacitor C is only one of many well-known delay means suitable for use with this invention.

FIGURE 6 is a circuit diagram of two stages of a shift register having *n* cascaded stages and utilizing the flip-flop circuit of this invention. Each stage of the shift register has a flip-flop similar to the flip-flop shown at stage 1 of FIGURE 1. A shift pulse source 18 is connected to the common terminal A of each stage of the shift register. A data input source 9 is connected to the input terminals H and J of the first stage of the register. Each stage of the register includes four logical elements of the type described in conjunction with FIGURES 2 and 3. The common trigger or shift terminal A is connected to one input of logical element 1 and of logical element 2. Input terminal H is connected to another input of logical element 1 and input terminal J is connected to another input of logical element 2. The NOR output of logical element 1 is connected to an input of logical element 3. The NOR output of logical element 2 is connected to an input of logical element 4. The NOR output of logical element 3 is connected to an output terminal F and to an input of logical element 4. The NOR output of logical element 4 is connected to an output terminal G and to an input of logical element 3. The OR output of logical element 3 is connected to an output terminal K. The OR output of logical element 4 is connected to an output terminal L. The OR outputs of logical elements 1 and 2 are not utilized. The terminal K of stage 1 is connected through a delay means 16 to the input terminal J of stage 2. The terminal L of stage 1 is connected through a delay means 17 to an input terminal H of stage 2. Terminals K and L of stage 2 are connected through like delay means (not shown) to input terminals H and J of stage 3 (not shown) and so on. The terminals F and G of each stage of the register may be connected to any suitable utilization means.

The circuit operates in the following manner:

Initially, all stages of the register are assumed to be in the reset condition. Stage 1 of the register is set by concurrent operation of the shift pulse source 18 and the data input source 9. The application of the shift pulse does not disturb the reset condition of any of the other stages of the register because in the reset condition all the terminals J are at a binary 1 level and the terminals H are at a binary 0 level. At the termination of the shift pulse, stage 1 is set and the terminals H and J of stage 2 are now at binary 1 and binary 0 levels, respectively. Consequently, the next shift pulse resets stage 1 and sets stage 2. Succeeding shift pulses shift the set condition of stage 2 to stage 3 (not shown), and so on. New data may be inserted into the first stage at any time that the shift pulse source 18 is operated. The delay means 16 and 17 perform the function of delaying the transfer of the output pulses from one stage to the next stage for the duration of the shift pulses.

What is claimed is:

1. An electrical circuit comprising four logical elements each including an input means, a NOR output means and an OR output means, first means for coupling the NOR output means of a third one of said logical elements to the input means of a fourth one of said logical elements and for coupling the NOR output means of the fourth logical element to the input means of the third logical element, second means for coupling the NOR output means of the first logical element to the input means of the third logical element and for coupling the NOR output means of the second logical element to the input means of the fourth logical element, and third means for coupling the OR output means of the third logical element to the input means of the first logical element and for coupling the OR output means of the fourth logical element to the input means of the second logical element.

2. An electrical circuit comprising first and second logical elements each including an input means and a NOR output means, first means for applying input signals to the input means of said first and second logical elements, third and fourth logical elements each including an input means, a NOR output means, and an OR output means, second means for coupling the NOR output means of said third logical element to the input means of said fourth element and for coupling the NOR output means of said fourth element to the input means of said third element, third means for coupling the NOR output means of said first logical element to the input means of the third logical element and for coupling the NOR output means of said second logical element to the input means of said fourth logical element, and fourth means for coupling the OR output means of the third logical element to the input means of the first logical element and for coupling the OR output means of said fourth logical element to the input means of said second logical element.

3. An electrical circuit as claimed in claim 2 wherein said fourth means includes means for delaying the respective OR output signals for the duration of the input signal.

4. An electrical circuit comprising four logical elements each including an input means, a NOR output means and an OR output means, first means for applying input signals to the input means of first and second ones of said logical elements, second means for coupling the output means of a third one of said logical elements to the input means of a fourth one of said elements and for coupling the output means of said fourth element to the input means of said third element, third means for coupling the NOR output means of said first and second logical elements to the input means of said third and fourth logical elements, respectively, and fourth means for coupling the OR output means of said third and fourth logical elements to the input means of said first and second logical elements, respectively.

5. An electrical circuit comprising four logical elements each including an input means and first and second complementary output means, first means for applying input signals to the input means of first and second ones of said logical elements, second means for coupling the output means of a third one of said logical elements to the input means of a fourth one of said elements and for coupling the output means of said fourth element to the input means of said third element, third means for coupling the first output means of the first logical element to the input means of the third logical element and for coupling the first output means of the second logical element to the input means of the fourth logical element, and fourth menas for coupling the second output means of the third logical element to the input means of the first logical element and for coupling the second output means of the fourth logical element to the input means of the second logical element.

6. A register circuit comprising a plurality of cascaded stages, each stage being comprised of, first and second logical elements each including an input means and a NOR output means, third and fourth logical elements each including an input means, a NOR output means, and an OR output means, first means for coupling the NOR output means of said third element to the input means of said fourth element and for coupling the NOR output means of said fourth element to the input means of said third element, second means for coupling the NOR output means of the first logical element to the input means of the third logical element and for coupling the NOR output means of the second logical element to the input means of the fourth logical element, third means for applying shift pulses to the input means of the first and second logical elements of each stage, and fourth means for coupling the OR ouputs of the third and fourth logical elements of each stage to the input means of the first and second logical elements of the next succeeding stage.

7. A register circuit as claimed in claim 6 wherein said fourth means includes means for delaying the respective OR output signals for the duration of the shift signal.

8. Pulse counter apparatus comprising at least two stages, each stage including, four logical elements each including an input means, a NOR output means and an OR output means, first means for coupling the NOR output means of a first one of said logical elements to the input means of a third one of said logical elements and for coupling the NOR output means of a second one of said logical elements to the input means of a fourth one of said logical elements, second means for coupling the NOR output means of said third element to the input means of said fourth element and for coupling the NOR output means of said fourth element to the input means of said third element, third means for coupling the OR output means of the third logical element to the input means of the first logical element and for coupling the OR output means of the fourth logical element to the input means of the second logical element, means for coupling one of the OR output means of the first and second logical elements of a first stage directly to the input means of the first and second logical elements of a second stage, and means for applying pulses to be counted to the input means of the first and second logical elements of said first stage.

9. An electrical circuit comprising four logical elements each including an input means and first and second complementary output means, first means for applying input signals to the input means of first and second ones of said logical elements, second means for coupling the output means of a third one of said elements to the input means of a fourth one of said elements and for coupling the output means of said fourth element to the input means of said third element, third means for coupling the first output means of the first and second logical elements to the input means of the third and fourth logical elements, respectively, and fourth means for coupling the second output means of the third and fourth logical elements to the input means of the first and second logical elements, respectively.

References Cited by the Examiner

UNITED STATES PATENTS 3,110,821 11/1963 Webb ............. 307—88.5

ARTHUR GAUSS, *Primary Examiner.*